United States Patent [19]
Takayama et al.

[11] Patent Number: 5,956,087
[45] Date of Patent: Sep. 21, 1999

[54] LINEAR IMAGE SENSOR

[75] Inventors: Tsutomu Takayama, Kawasaki; Kazuhito Ohashi, Yokohama; Seiichirou Satomura, Kawasaki; Tomoichirou Ohta, Shimizu; Noriyoshi Chizawa, Yokohama; Masafumi Kamei, Shakujii-machi; Takashi Sugiura, Fukaya, all of Japan

[73] Assignee: Canon Kabushiki Kaisha, Tokyo, Japan

[21] Appl. No.: 08/739,213

[22] Filed: Oct. 29, 1996

[30] Foreign Application Priority Data

Oct. 31, 1995 [JP] Japan ..................... 7-283413

[51] Int. Cl.⁶ .......................... H04N 3/14; H04N 5/335; H04N 9/04; H04N 9/083
[52] U.S. Cl. ............................ 348/275; 348/315
[58] Field of Search ..................... 348/311, 315, 348/322, 323, 324, 275; 257/231, 234, 240

[56] References Cited

U.S. PATENT DOCUMENTS

| | | | |
|---|---|---|---|
| 4,471,387 | 9/1984 | Nadler | 358/293 |
| 4,516,154 | 5/1985 | Nishizawa | 348/275 |
| 4,663,535 | 5/1987 | Nakei et al. | 250/578 |
| 4,706,130 | 11/1987 | Yamakawa | 358/296 |
| 4,750,048 | 6/1988 | Satoh et al. | 358/257 |
| 4,762,985 | 8/1988 | Imai et al. | 250/201 |
| 4,772,958 | 9/1988 | Suzuki | 358/294 |
| 5,128,533 | 7/1992 | Oguchi et al. | 250/208.1 |
| 5,150,204 | 9/1992 | Yamazaki | 348/275 |
| 5,506,617 | 4/1996 | Parulski et al. | 348/207 |

*Primary Examiner*—Wendy Garber
*Assistant Examiner*—Alicia M Harrington
*Attorney, Agent, or Firm*—Fitzpatrick, Cella, Harper & Scinto

[57] ABSTRACT

A linear image sensor includes N arrays of photoelectric converting pixels, wherein N is an even integer at least equal to 2. Each array is formed by arranging, with a predetermined pixel pitch in a first direction of the array, a plurality of pixels, and each of the pixels is so shaped that the area per unit length of the pixel decreases progressively from the center of the pixel both in the first direction of the array and in a second direction perpendicular to the first direction. The N arrays themselves are provided with a mutual distance from each other of M/2 times the pixel pitch in the second direction and are mutually displaced by 1/N of the pixel pitch in the first direction so as to form a mutually interpolating arrangement, wherein M is a positive integer equal to at least 1 and wherein M and N are independent of each other.

21 Claims, 11 Drawing Sheets

MTF OF SQUARE PIXEL IN x DIRECTION

MTF OF SQUARE PIXEL IN y DIRECTION AND MTF OF LOZENGE PIXEL IN x DIRECTION

MTF OF LOZENGE PIXEL IN y DIRECTION

ALIASING DISTORTION CHARACTERISTIC FOR MTF NORMARIZED TO 1.0

LINEAR IMAGE SENSOR

BACKGROUND OF THE INVENTION

1. Field of the Invention

The present invention relates to a linear image sensor adapted for use in an image reading apparatus such as a copying machine or a scanner.

2. Related Background Art

Conventionally, it is well known that linear image sensors are utilized in image reading apparatus, and CCD linear image sensor is a representative example of such linear image sensors.

FIGS. 16A and 16B are schematic views showing the configuration of such linear image sensor. Referring to FIG. 16A, there are shown photoelectric converting pixel elements 201-a, b, c, d, . . . arranged with a constant pitch in a one-dimensional array; shift gates 202-a, b, c, d, . . . for shifting the charges obtained by the photoelectric conversion in the photoelectric converting pixel elements 201-a, b, c, d, . . . ; a transfer unit 203 for successive transfer of thus shifted charges; and an output circuit 204 for releasing thus transferred charges in the form of sequential output signals. FIG. 16B is a magnified view of the photoelectric converting pixels 201-a, b in FIG. 16A.

In the following there will be explained the function of such CCD linear image sensor when it is employed in an image reading apparatus such as a scanner or a digital copying machine.

The original image to be read is illuminated in a linear shape, and an optical image focused on the array of the photoelectric converting pixels 201-a, b, c, d, . . . for example through an optical lens moves in the sub scanning direction shown in FIG. 16B (hereinafter represented as y-direction) at a predetermined speed. In a predetermined period required by the focused image to move from a position A to B shown in FIG. 16B, the charges accumulated by the photoelectric conversion in the photoelectric converting pixels 201-a, b, c, d, . . . are shifted to the transfer unit 203, and the corresponding output signals are released from the output circuit 204 in a predetermined period required by the focused image to move from the position B to C.

In general, as shown in FIG. 16B, the distance AB (and distance BC) is selected equal to the pitch P of the photoelectric converting pixels in the main scanning direction (hereinafter represented as x-direction), in order to obtain a same resolving power in the x- and y-directions.

In such conventional configuration, in order, for example, to double the resolving power, it is necessary to reduce the pitch P of the photoelectric converting pixels to ½, by reducing the pixel size of the photoelectric converting pixels 201-a, b, c, d, . . . to ½ both in the x- and y-directions. It is also necessary to reduce the above-mentioned periods to ½.

In such case, the area of the photoelectric converting pixel is reduced to ¼ and the photoelectric converting time is also reduced to ½, so that the sensitivity is reduced to ⅛, whereby the image quality is significantly deteriorated. Moreover the doubled transfer rate adversely affects the charge transfer performance, and also leads to an increase in the heat generation in the transfer unit and in the power consumption, and these factors naturally affect disadvantageously the quality of the image obtained in the image forming apparatus.

Among the above-mentioned factors, the deficiency in sensitivity may be coped with by an increase in the size of the photoelectric converting pixels and a reduction in the imaging magnification of the lens. For example the original sensitivity may be recovered by increasing the size of the photoelectric converting pixels by about 2.8 times both in the x- and y-directions, but, in such case, the transfer unit also becomes larger in size, thus giving rise to an even larger deterioration of the charge transfer performance and an even large heat generation, whereby the deterioration of the image quality inevitably becomes more conspicuous. Also the chip size becomes about 2.8 times in the x-direction, leading to a major increase in the cost of the linear image sensor and the lens.

SUMMARY OF THE INVENTION

In consideration of the foregoing, the object of the present invention is to provide a linear image sensor of high performance, capable of providing a high resolving power and a high sensitivity at the same time.

The above-mentioned object can be attained, according to an embodiment of the present invention, by a linear image sensor utilizing a photoelectric converting pixel array formed by arranging, with a predetermined pixel pitch in the direction of array, a plurality of pixels each of which is so formed that the area per unit length decreases from the center of the pixel both in the direction of array and in a direction perpendicular to the direction of array, and comprising N such arrays of the photoelectric converting pixels arranged with a mutual distance equal to K/2 times of the pixel pitch and in such a manner that such arrays are mutually displaced by 1/N of the pixel pitch in the direction of array so that the pixels mutually compensate in area.

Such configuration allows to provide a linear image sensor of a high resolving power without sacrificing the sensitivity.

Other objects of the present invention, and the features thereof, will become fully apparent from the following description, which is to be taken in conjunction with the attached drawings.

DESCRIPTION OF THE PREFERRED EMBODIMENTS

Now the linear image sensor of the present invention, capable for reading an image and outputting corresponding signals and adapted for use in an image forming apparatus, will be explained with reference to the attached drawings.

Figure 1A:
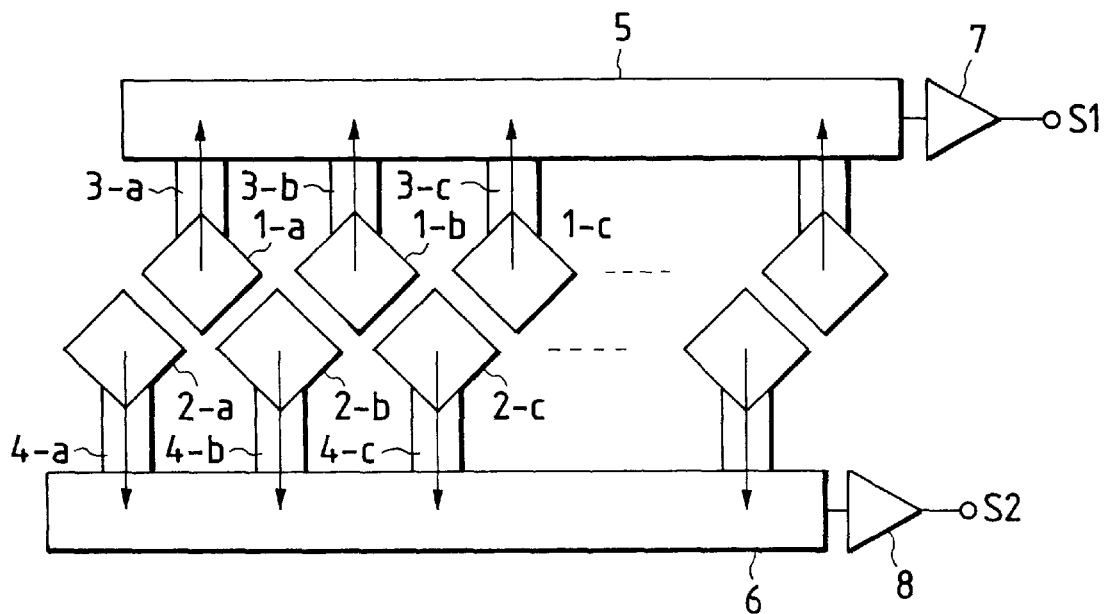
FIGS. 1A and 1B are views showing the configuration of a CCD linear image sensor constituting a first embodiment of the present invention.
Figure 1B:
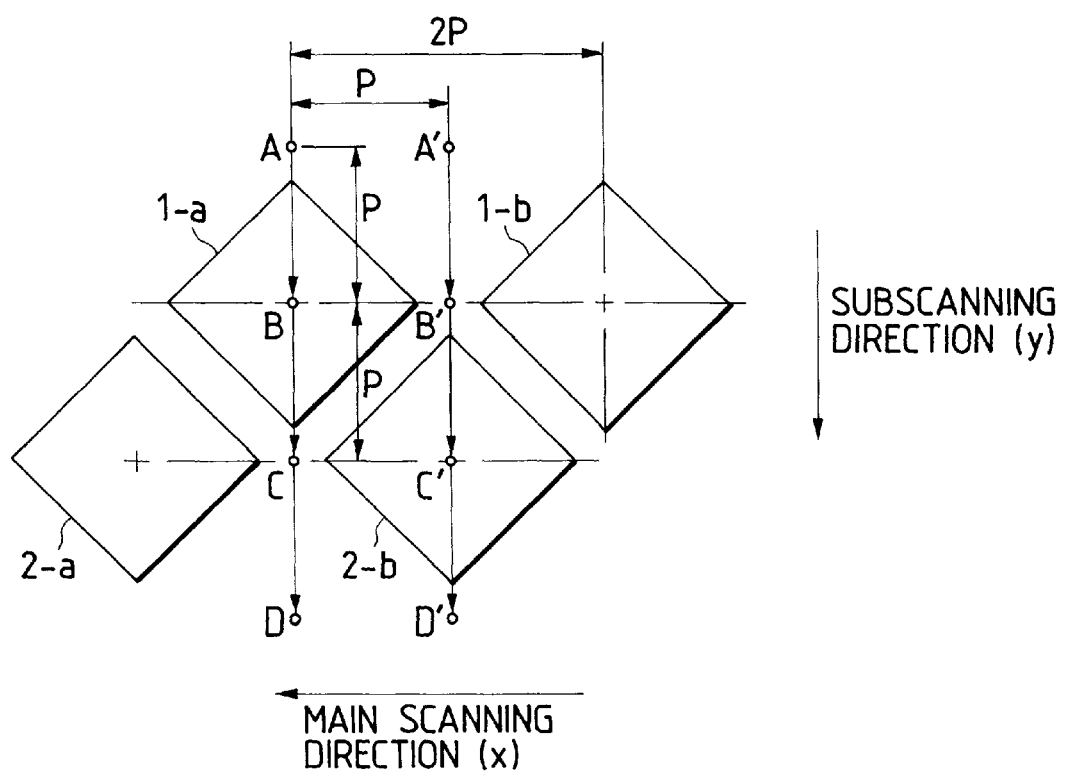

FIGS. 1A and 1B are views showing the configuration of a linear image sensor, best representing the features of the present invention.

In FIG. 1A there are shown arrays 1-a, b, c, . . . , 2-a, b, c, . . . of lozenge photoelectric converting pixels arranged one-dimensionally with a constant pitch in the x-direction; shift gates 3-a, b, c, . . . , 4-a, b, c, . . . , for shifting the charges respectively obtained by photoelectric conversion in the photoelectric converting pixel arrays 1-a, b, c, . . . , 2-a, b, c, . . . ; transfer units 5, 6 for successive transfer of the shifted charges; and output circuits 7, 8 for outputting thus transferred charges as sequential output signals S1, S2.

FIG. 1B is a magnified view of the photoelectric converting pixels 1-a, b and 2-a, b in FIG. 1A. The photoelectric converting pixel arrays 1-a, b, c, . . . and 2-a, b, c, . . . have a pixel pitch 2P in the x-direction (main scanning direction), and have a mutual distance P, which is equal to ½ of the above-mentioned pixel pitch, in the y-direction (sub scanning direction). Also the arrays 1-a, b, c, . . . and 2-a, b, c, . . . are so arranged that each pixel in one of the arrays is positioned at the center of two pixels in the other.

Figure 2:
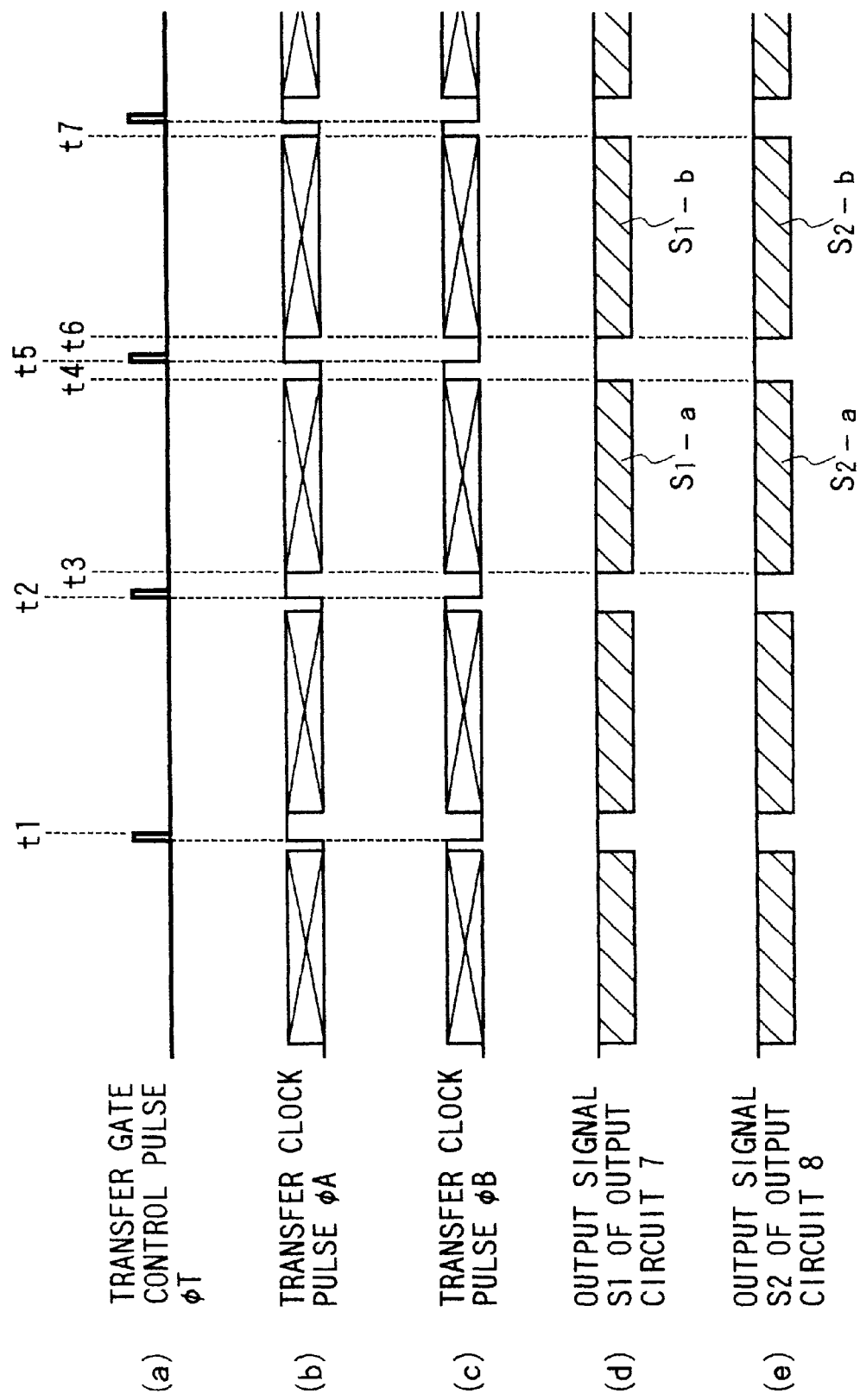
FIG. 2 is a timing chart showing the function of the first embodiment of the present invention.

FIG. 2 is a timing chart showing the function of the present embodiment.

In FIG. 2, (a) indicates a shift gate control pulse φT for controlling the shift gates 3-a, b, c, and 4-a, b, c, . . . which respectively shift the charges of the photoelectric converting pixel arrays 1-a, b, c, . . . , 2-a, b, c, . . . to the transfer units 5, 6 when the control pulse φT assumes the "H" level state. Also (b) and (c) indicate transfer clock pulses φA, φB to be respectively supplied to the transfer units 5, 6. Normally the number of pulses φA (or φB) in a cycle is selected approximately equal to the number of photoelectric converting pixels in the array 1-a, b, c, . . . (or 2-a, b, c, ...), and the pulses φA and φB have a duty ratio of 50% and are supplied in mutually opposite phases. (d) and (e) respectively indicate the output signals S1, S2 of the output circuits 7, 8.

In such configuration, an optical image formed in a position A shown in FIG. 1B at a time t1 in FIG. 2 moves in the y-direction with a predetermined speed and reaches a position B at a time t2. At the same time an optical image at a position A' moves to a position B'. Then the shift gate control pulse φT and transfer clock pulse φA are shifted to the "H" level state, whereby the charges accumulated in the photoelectric converting pixel arrays 1-a, b, c, . . . and 2-a, b, c, . . . are respectively shifted to the transfer units 5, 6.

Then, within a period from a time t2 to t5 required by the image to move from a position B to C (or from B' to C'), in a period from t3 to t4, the charges shifted to the transfer unit 5, 6 are transferred in succession and released as output signals S1-a, S2-a from the output circuits 7, 8. Then the shift gate control pulse φT and transfer clock pulse φA again assume the "H" level state at the time t5, whereby the charges accumulated in the photoelectric converting pixel arrays 1-a, b, c, 2-a, b, c, . . . in the period from t2 to t5 are respectively shifted to the transfer units 5, 6. These charges are successively transferred in a period from t6 to t7 to release output signals S1-b, S2-b.

Thereafter the above-explained cycles are repeated.

In the present embodiment, since the distances AB (or A'B') and BC (or B'C') of the image movement in the y-direction in a predetermined period is selected equal to the mutual distance P of the photoelectric converting pixel arrays 1-a, b, c, . . . , 2-a, b, c, . . . as shown in FIG. 1B, a line-shaped optical image moving on the array 1-a, b, c, . . . in the period from t1 to t2 moves on the array 2-a, b, c, . . . in the period from t2 to t5. Consequently, the output signal S1-a from the output circuit 7 and the output signal S2-b from the output circuit 8 with a delay of a cycle are both obtained from the optical image of a same line.

Also since the photoelectric converting pixel arrays 1-a, b, c, . . . and 2-a, b, c, . . . are so positioned that each pixel in either array is at the center of two pixels in the other array, the output signals S1-a and S2-b are obtained in a mutually interpolating form.

Figure 3:
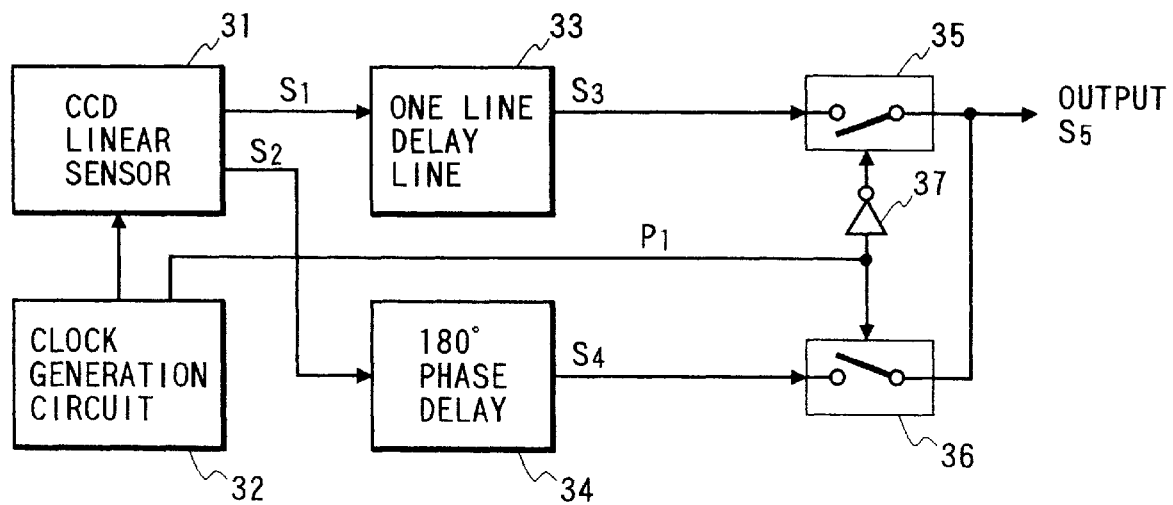
FIG. 3 is a block diagram of an image processing circuit adapted for use in the first embodiment of the present invention.

FIG. 3 is a block diagram of a circuit for processing thus obtained output signals.

There are shown a CCD linear image sensor 31 of the configuration shown in FIG. 1A, a clock generator 32 for generating clock pulses for driving the CCD linear image sensor 31, a 1-line delay line 33 for delaying, by a cycle, the output signal S1 of the output circuit 7 shown in FIG. 1A, a delay circuit 34 for effecting a phase delay, by a period corresponding to ½ of a pixel or to 180°, the output signal S2 of the output circuit S2 shown in FIG. 1A, analog switch circuits 35, 36, and an inverter 37 for inverting the pulse for on/off control of the analog switch circuit 35.

Figure 4:
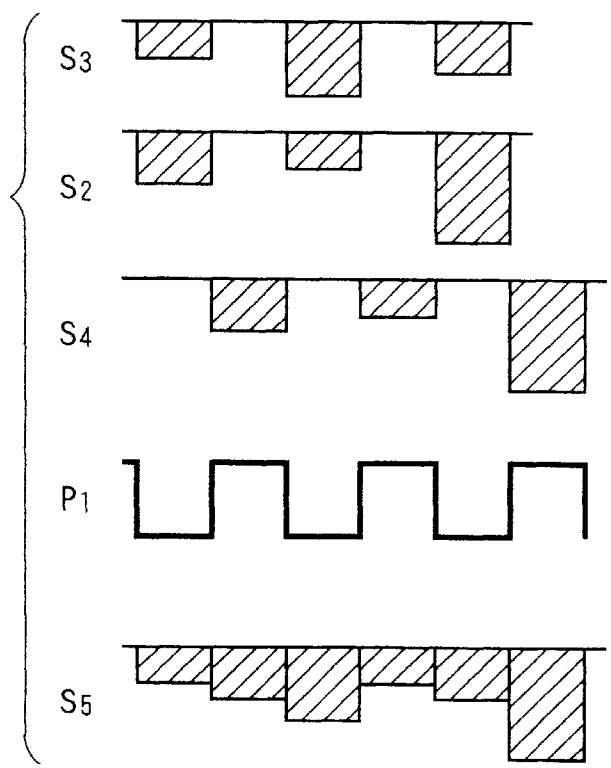
FIG. 4 is a signal waveform chart for explaining the function of the circuit of the block diagram in FIG. 3.

FIG. 4 is a signal waveform chart for explaining the function of the circuit in the above-explained block diagram, showing the states of signals sampled in respective pixels.

In FIG. 4 there are shown an output signal S3 of the 1-line delay line 33 shown in FIG. 3, an output signal S2 of the output circuit 8, an output signal S4 of the 180° phase delay circuit 34, and an output signal S5 of the analog switch circuits 35, 36. P1 indicates a pulse signal for on/off control of the analog switch circuits 35, 36 which are respectively turned on in the "L" and "H" level states of the pulse signal P1.

Since the signal S3 is obtained by 1-line delay of the output signal S1 of the output circuit 7, the signals S3 and S2 are obtained from a same line-shaped optical image and are so spatially sampled that the optical image between the pixels in either of these signals is interpolated by the other. Also as the signal S4 is obtained by a phase delay of 180° of S2, the signal S4 is opposite in phase to S3. Also as the analog switch circuit 36 is turned on when the control pulse assumes the "H" level state, the analog switch circuits 35 and 36 are alternately turned on. Consequently the signal S5 is obtained by extracting in succession the significant portions of the signals S3 and S4, and constitutes a point-sequential signal of a higher resolving power, with a doubled number of spatial sampling.

In the following there will be explained the modulation transfer function (MTF) in case the photoelectric converting pixels have a lozenge or rhombic shape.

Figure 5:
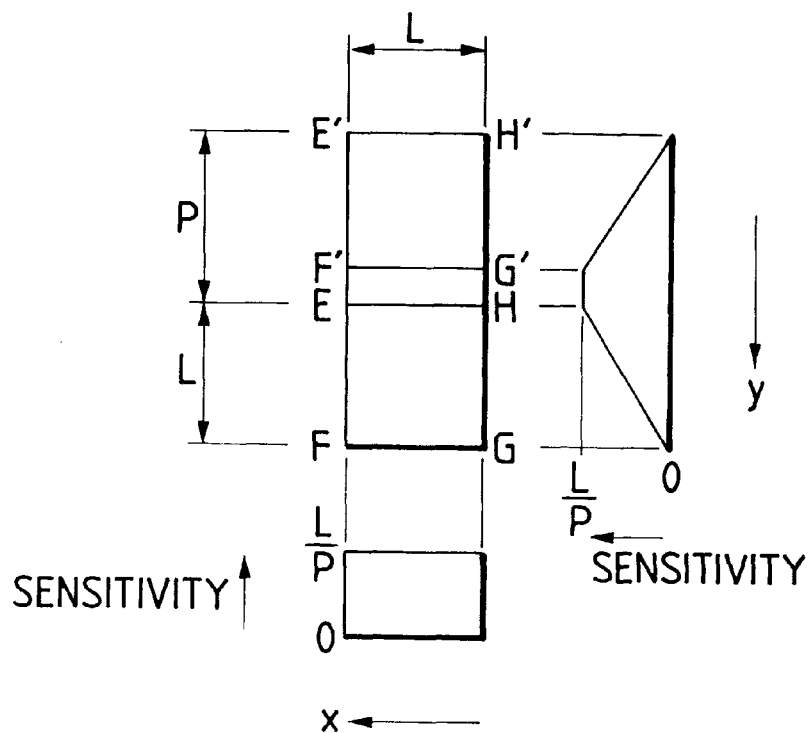
FIG. 5 is a three-dimensional view showing the sensitivity distribution of a square pixel in a state of movement in the y-direction.
Figure 16A:
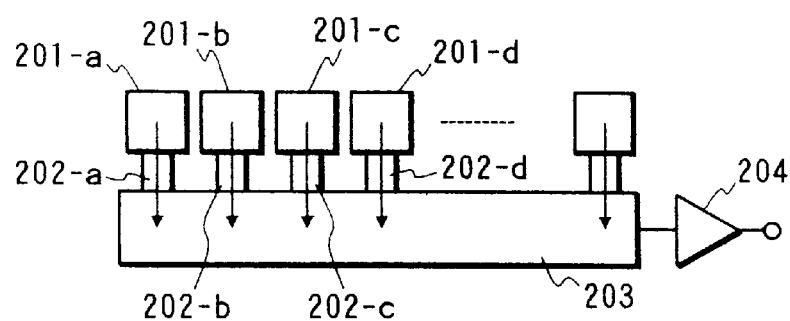
FIGS. 16A and 16B are views showing the configuration of a conventional CCD linear image sensor.
Figure 16B:
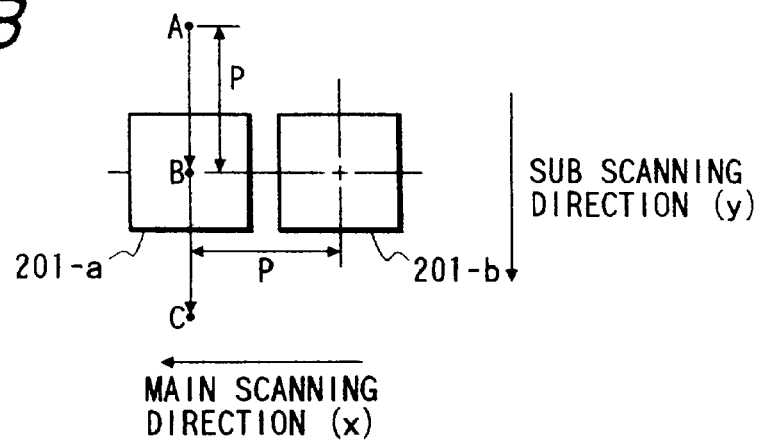

At first there will be explained a case with square pixels for comparison. FIG. 5 shows a three-dimensional sensitivity distribution in a photoelectric converting pixel as in the prior art shown in FIG. 16B. In this representation, it is assumed, instead of moving the optical image by P in the y-direction, that the photoelectric converting pixel 201-a moves by P in a direction opposite to the y-direction.

The pixel is assumed to have a square shape EFGH with a lateral length L, and a rectangle EHG'F' is defined between such square EFGH and another square E'F'G'H' obtained by moving the square EFGH by P in a direction opposite to the y-direction. The sensitivity is highest in such rectangle EHG'F', uniform in the x-direction but gradually decreases in the y-direction from EH to FG and from F'G' to E'H', and the distribution of the sensitivity is symmetrical to a line connecting the center points of EF' and G'H'.

Figure 6:
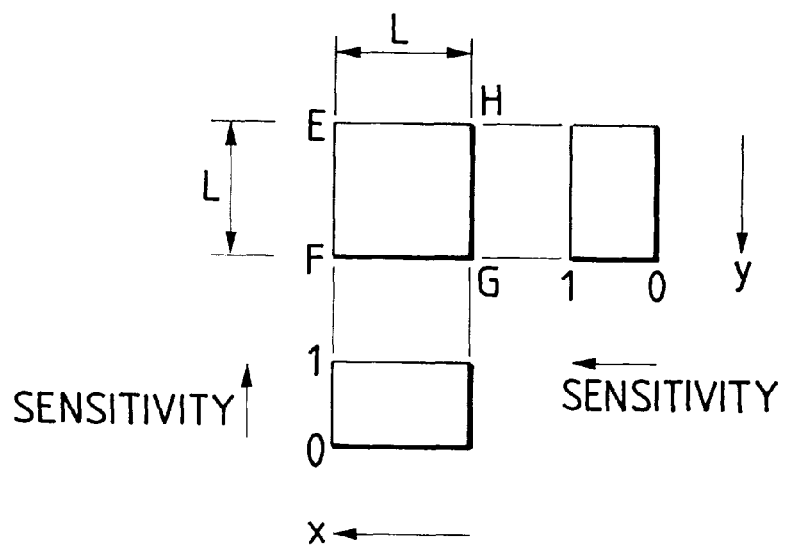
FIG. 6 is a three-dimensional view showing the sensitivity distribution of a square pixel in a standstill state.

On the other hand, the sensitivity distribution in case the square EFGH does not move is represented, as shown in FIG. 6, by a square pillar having the square EFGH as the bottom and having a height equal to sensitivity (defined as "1"). In comparison with this case, the maximum sensitivity in the case shown in FIG. 5 is given by L/P.

The modulation transfer function MTF in the x-direction under the above-mentioned sensitivity distribution is determined in the following manner. Referring to FIG. 5, there stands a relation (1), wherein Sx1 stands for the cross sectional area in the x-direction:

$$Sx1 = (\tfrac{1}{2})\{(P+L)+(P-L)\} \times L/P = L \qquad (1)$$

As the equation indicates, since the optical image does not move in the x-direction, the cross sectional area is equal to that in the x-direction of the square pillar, representing the sensitivity distribution when the square EFGH does not move.

The modulation transfer function in the x-direction can be represented by the ratio of the difference $\Delta X11$ in the signal charge obtainable from the pixel, between a case where the maximum light intensity is positioned at the pixel center and a case where the minimum light intensity is positioned at the pixel center, in a situation where the intensity of the light entering the photoelectric converting pixel varies in sinusoidal manner in the x-direction, to the difference $\Delta X_0 1$ in the signal charge, between a case of the maximum light intensity and a case of the minimum light intensity, in a situation where the light entering the photoelectric converting pixel has a uniform intensity.

When the light intensity varies in sinusoidal manner, the difference $\Delta I$ of the light intensity alone between the case of maximum light intensity ("1") and the case of minimum light intensity ("0") can be represented by:

$$\Delta I = (\tfrac{1}{2})(1+\cos\omega\chi) - (\tfrac{1}{2})(1-\cos\omega\chi) = \cos\omega\chi \qquad (2)$$

wherein

ω: spatial angular frequency

χ: spatial distance in the x-direction from a central line connecting the central points of lines EF' and G'H'.

Consequently $\Delta X11$ mentioned above can be represented by:

$$\Delta X11 = 2\int_0^{L/2} Sx1 \cdot \Delta I dx = 2\int_0^{L/2} L \cdot \cos\omega x\, dx \qquad (3)$$
$$= (2L/\omega)\sin(\omega L/2)$$

Also $\Delta X_0 1$ can be represented by:

$$\Delta X_0 1 = 2\int_0^{L/2} Sx1 \cdot \Delta I dx = 2\int_0^{L/2} L dx = L^2 \qquad (4)$$

Thus the modulation transfer function MTFx1 in the x-direction can be obtained as:

$$MTFx1 = \Delta X11/\Delta X_0 1 = (2/\omega L)\sin(\omega L/2) \qquad (5)$$

Now there will be determined the modulation transfer function in the y-direction. Referring to FIG. 5, there is obtained the following equation, wherein Sy1 stands for the cross sectional area at a position of a spatial distance y $(y \geq (\tfrac{1}{2})(P-L))$, in the y-direction, from a line connecting the center points of the lines EF' and GH':

$$Sy1 = L \cdot \{(\tfrac{1}{2}L)(P+L) - (y/L)\} \qquad (6)$$

Assuming that the light intensity varies one-dimensionally in sinusoidal manner in the y-direction as mentioned above, the difference $\Delta Y11$ in the signal charge obtainable from the pixel, between a case where the maximum light intensity is positioned on a line connecting the center points of EF' and GH' and a case where the minimum light intensity is positioned on the above-mentioned line, is given by:

$$\Delta Y11 = 2\int_0^{(1/2)(P-L)} L \cdot \Delta I dy + 2\int_{(1/2)(P-L)}^{(1/2)(P+L)} Sy1 \cdot \Delta I dy \qquad (7)$$
$$= 2\int_0^{(1/2)(P-L)} L\cos\omega y\, dy +$$
$$2\int_{(1/2)(P-L)}^{(1/2)(P+L)} L \cdot \{(1/2L)(P+L) - (y/L)\}\cos\omega y\, dy$$
$$= (2/\omega^2)\{\cos(\omega/2)(P-L) - \cos(\omega/2)(P+L)\}$$

The difference in the signal charge, between a case of the maximum light intensity and a case of the minimum light intensity in a situation where the light entering has a uniform light intensity, is same as $\Delta X01$ mentioned above.

Consequently the modulation transfer function MTFy1 in the y-direction is given by:

$$MTFy1 = \Delta Y11/\Delta X_0 1 \qquad (8)$$
$$= (2/\omega^2 L^2)\{\cos(\omega/2)(P-L) - \cos(\omega/2)(P-L)\}$$

If the lateral length L of the pixel is equal to the pitch P of the pixels, the modulation transfer functions in the x- and y-directions become:

$$MTFx1 = (2/\omega P)\sin(\omega P/2) = (fs/\pi f)\sin(\pi f/fs) \qquad (9)$$

$$MTFy1 = (2/\omega^2 P^2)\{1 - \cos(\omega/2)(P+L)\} \qquad (10)$$
$$= (2/\omega P)^2 \sin^2(\omega P/2) = (fs/\pi f)^2 \sin^2(\pi f/fs)$$

wherein f: spatial frequency fs: spatial sampling frequency (reciprocal of pixel pitch P).

If the spatial frequency f is ½ of the spatial sampling frequency fs, or is namely equal to Nyquist's frequency fn:

$$f = \tfrac{1}{2} fs = fn \tag{11}$$

the modulation transfer functions MTFx1(N), MTFy1(N) in the x- and y-directions at the Nyquist's frequency are given by:

$$MTFx1(N) = 2/\pi \approx 0.64 \tag{12}$$

$$MTFy1(N) = (2/\pi)^2 \approx 0.41 \tag{13}$$

Consequently the MTF in the y-direction is deteriorated, by the movement of the optical image, to about ⅔ of the MTF in the x-direction.

In the following there is determined the modulation transfer function of the photoelectric converting pixel of lozenge form employed in the present embodiment.

Figure 7:
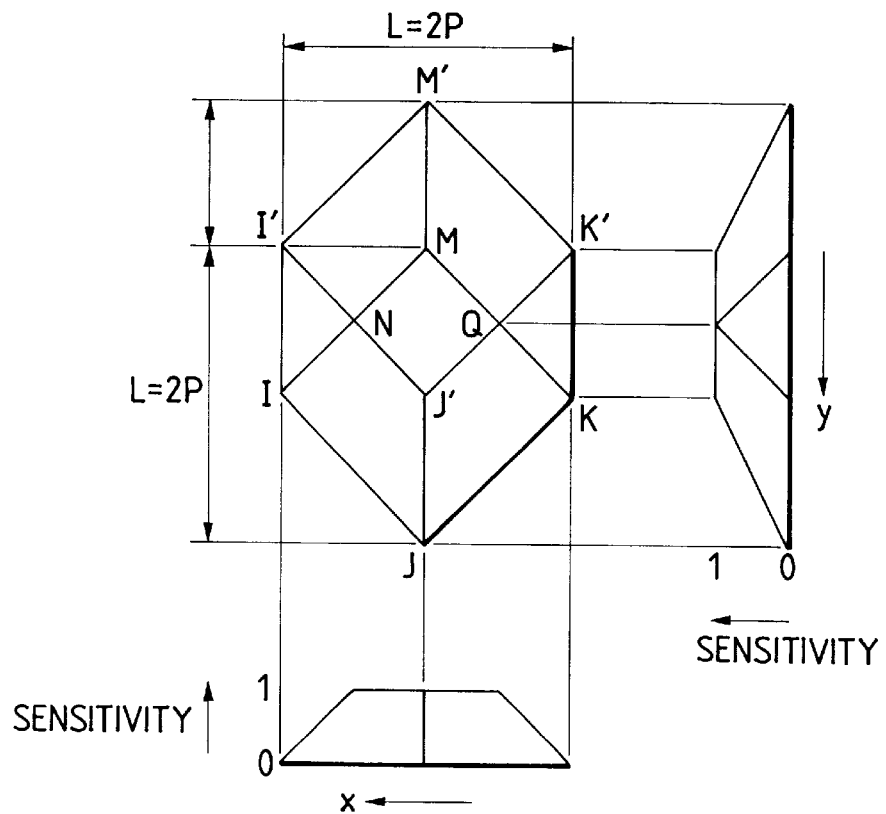
FIG. 7 is a three-dimensional view showing the sensitivity distribution of a lozenge pixel in a state of movement in the y-direction.

FIG. 7 shows a three-dimensional sensitivity distribution in a photoelectric converting pixel as shown in FIG. 1B. In this representation, it is assumed, instead of moving the optical image by the distance P of two pixels in the y-direction, that the photoelectric converting pixel 1-a moves by P in a direction opposite to the y-direction. For simplifying the calculation, the diagonal length L in the x- and y-directions of the lozenge IJKL is selected as twice of the distance P.

A lozenge MNJ'Q is defined by crossing points N, Q of the lozenge IJKM and a lozenge I'J'K'M' obtained by moving the lozenge IJKM by P in a direction opposite to the y-direction, and by vertexes M, J'. The sensitivity distribution is highest ("1") in such lozenge MNJ'Q, decreases in the x-direction symmetrically with respect to a line connecting the vertexes J, M' and gradually decreases in the y-direction symmetrically with respect to a line connecting the vertexes N and Q.

Figure 8:
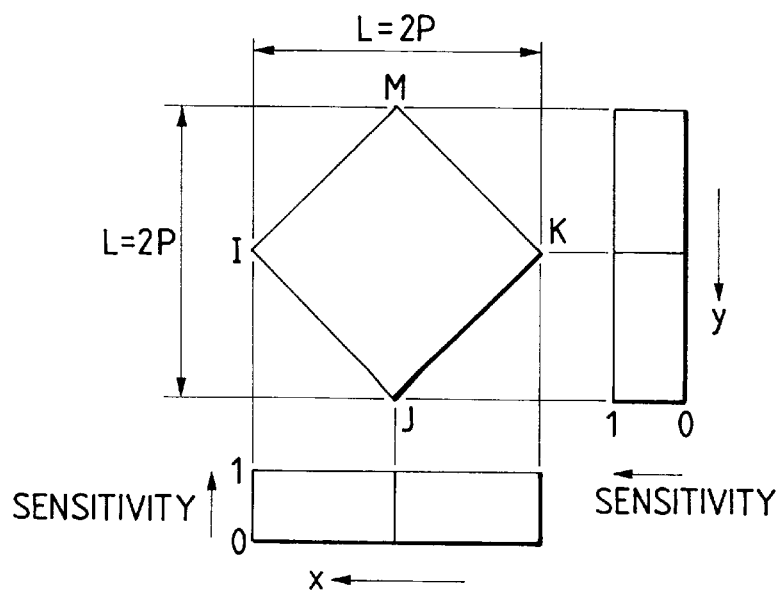
FIG. 8 is a three-dimensional view showing the sensitivity distribution of a lozenge pixel in a standstill state.

The modulation transfer function MTF in the x-direction under the above-mentioned sensitivity distribution is determined in the following manner. Since the lozenge IJKM does not move in the x-direction as mentioned in the foregoing, the cross sectional area, in the x-direction, of the three-dimensional body shown in FIG. 7 is equal to that (referred to by "Sx2") in the x-direction of a lozenge pillar, having the lozenge IJKM as the bottom and a height equal to the sensitivity "1" as shown in FIG. 8 and representing the sensitivity distribution when the lozenge IJKM does not move. Consequently there is obtained the following equation:

$$Sx2 = (L/2 - \chi) \cdot 1 = L/2 - \chi \tag{14}$$

The difference ΔX12 in the signal charge obtainable from the pixel, between a case where the maximum light intensity is positioned at the central line JM' and a case where the minimum light intensity is positioned at the above-mentioned central line, and the difference $\Delta X_0 2$ in the signal charge, between a case of the maximum light intensity and a case of the minimum light intensity, in a situation where the light entering the photoelectric converting pixel has a uniform intensity are given by:

$$\Delta X12 = 4 \int_0^{L/2} Sx2 \cdot \Delta I d x = 4 \int_0^{L/2} (L - 2x)\cos \omega x\, dx \tag{15}$$

$$= (4/\omega^2)\{1 - \cos(\omega L/2)\} = (8/\omega^2)\sin^2(\omega L/4)$$

$$\Delta X_0 2 = L \cdot (L/2) = L^2/2 \tag{16}$$

Consequently the modulation transfer function MTFx2 is given by:

$$MTFx2 = \Delta X12 / \Delta X_0 2 = (4/\omega L)^2 \sin^2(\omega L/4) \tag{17}$$

Since L=2P:

$$MTFx2 = (2/\omega P)^2 \sin^2(\omega P/2) \tag{18}$$

$$= (fs/\pi f)^2 \sin^2(\pi f/fs)$$

wherein f is the spatial frequency and fs is the spatial sampling frequency, as already explained in the foregoing. As will be apparent from the comparison with the equation (10), the MTFx2 is equal to the modulation transfer function of the square pixel in the y-direction. Consequently, the modulation transfer function MTFx2(N) in case the spatial frequency f is ½ of the spatial sampling frequency fs or is the Nyquist's frequency fn is given by:

$$MTFx2(N) = MTFy1(N) = (2/\pi)^2 \approx 0.41 \tag{19}$$

In the following there is determined the MTF in the y-direction.

At first the cross sectional area, in the y-direction, of the three-dimensional body shown in FIG. 7 is obtained by decomposing such body. The three-dimensional body shown in FIG. 7 is composed of the following three-dimensional bodies:

(1) a lozenge pillar having the lozenge MNJ'Q as the bottom face and the maximum sensitivity "1" as the height;

(2) two triangular cones of a same size (for example a triangular cone having a triangle INI' as the bottom face and a vertex at the crossing point of a normal line parallel to the axis of sensitivity from the vertex N, with the bottom IJKK'M'I');

(3) four tetragonal cones of a same size (for example a tetragonal cone having a tetragon formed by the vertexes N, J' and by the two crossing points of normal lines parallel to the axis of sensitivity from the vertexes N, J' with the bottom IJKK'M'I', as the bottom face, and having a height equal to a line connecting the vertex I with the crossing point of a normal line parallel to the axis of sensitivity from the vertex N, with the bottom IJKK'M'I'); and (4) four triangular cones of a same size (for example a triangular cone having a triangle IJJ' as the bottom face and the vertex at the crossing point of a normal line parallel to the axis of sensitivity from the vertex J, with the bottom IJKK'M'I').

The cross sectional areas Sy21, Sy22, Sy23, Sy24 of the above-mentioned four three-dimensional bodies, at a spatial distance y, in the y-direction, from the central line (connecting M and N) in the y-direction, are given by:

$$Sy21 = (L/2 - 2y) \cdot 1 = L/2 - 2y \tag{20}$$

$$Sy22 = (\tfrac{1}{2})(L/4 - y)(1 - 4y/L) \tag{21}$$

$$Sy23 = (\tfrac{1}{2})\{1 + (1 - 4y/L)\}2y = (2 - 4y/L)y \tag{22}$$

$$Sy24 = (1/2)(3L/4 - y)(3/2 - 2y/L) \qquad (23)$$

The difference $\Delta Y12$ in the signal charge obtainable from the pixel, between a case where the maximum light intensity is positioned at the central line NQ and a case where the minimum light intensity is positioned at the above-mentioned central line, and the difference $\Delta Y_0 2$ in the signal charge, between a case of the maximum light intensity and a case of the minimum light intensity, in a situation where the light entering the photoelectric converting pixel has a uniform intensity are given in the following:

$$\begin{aligned} \Delta Y12 &= 2\int_0^{L/4} Sy21 \cdot \Delta Id\, y + 4\int_0^{L/4} Sy22 \cdot \Delta Id\, y + \\ &\quad 4\int_0^{L/4} Sy23 \cdot \Delta Id\, y + 4\int_{L/4}^{3/4L} Sy24 \cdot \Delta Id\, y \\ &= \int_0^{L/4}(2Sy21 + 4Sy22 + 4Sy23) \cdot \Delta Id\, y + \\ &\quad 4\int_{L/4}^{3/4L} Sy24 \cdot \Delta Id\, y \\ &= \int_0^{L/4}(3L/2 - 8y^2/L)\cos\omega y d\, y + \\ &\quad \int_{L/4}^{3/4L}(4y^2/L - 6y + 9L/4)\cos\omega y d\, y \\ &= (8/\omega^3 L)\{3\sin(\omega L/4) - \sin(3\omega L/4)\} \end{aligned} \qquad (24)$$

Since $\Delta Y_0 2$ is same as $\Delta X_0 2$ mentioned in the foregoing:

$$\Delta Y_0 2 = L^2/2 \qquad (25)$$

Consequently the modulation transfer function MTFy2 is given by:

$$\begin{aligned} MTFy2 &= \Delta Y12/\Delta Y_0 2 \\ &= 2(2/\omega L)^3 \{3\sin(\omega L/4) - \sin(3\omega L/4)\} \end{aligned} \qquad (26)$$

Since $L = 2P$:

$$MTFy2 = 2(1/\omega P)^3 \{3\sin(\omega P/2) - \sin(3\omega P/2)\} \qquad (27)$$

$$= 2(fs/2\pi f)^3 \{3\sin(\pi f/fs) - \sin(3\pi f/fs)\} \qquad (28)$$

The modulation transfer function MTFx2(N) in case the spatial frequency f is ½ of the spatial sampling frequency fs or is the Nyquist's frequency fn is given by:

$$MTFy2(N) = (2/\pi)^3 = 0.258 \qquad (29)$$

Figure 9A:
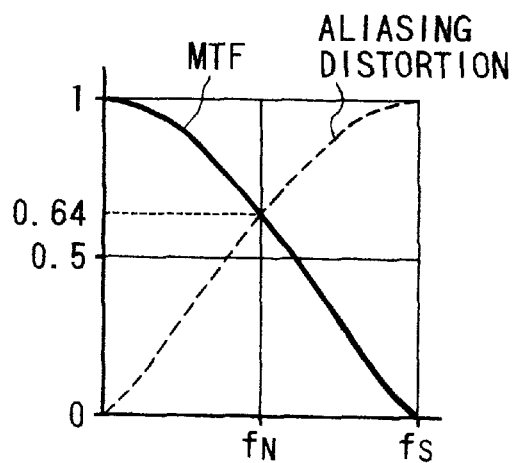
FIGS. 9A to 9D are charts showing modulation transfer function and aliasing distortion characteristics of a square pixel and a lozenge pixel.
Figure 9B:
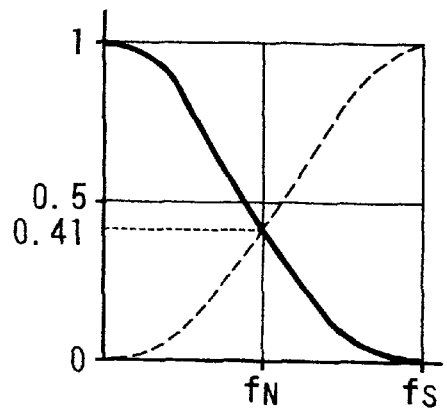
Figure 9C:
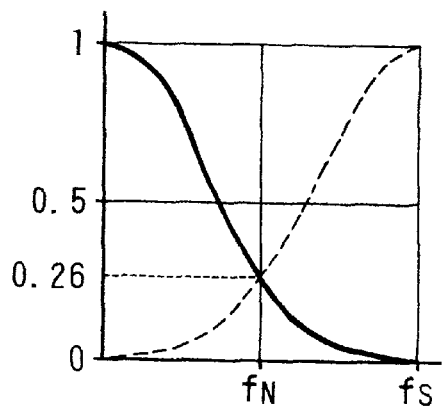
Figure 9D:
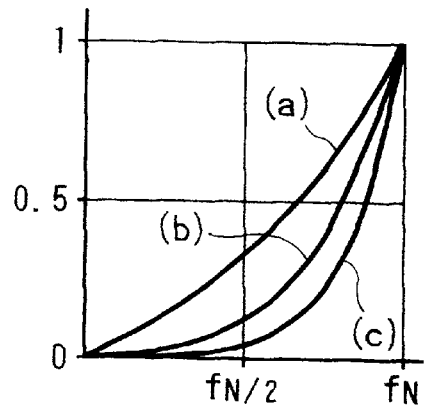

The results obtained in the foregoing equations (9), (10) and (27) are graphically represented respectively by solid lines (a), (b) and (c) in FIG. 9D.

In FIGS. 9A to 9D, broken lines indicate aliasing distortion characteristics from the sampling frequency. For the purpose of comparison, the modulation transfer functions in a frequency region from 0 to fn are corrected to 1.0 by an image signal processing, and the aliasing distortion characteristics thus obtained are shown in FIG. 9D, respectively corresponding to FIGS. 9A, 9B and 9C.

As will be apparent from FIG. 9D, the lozenge pixel provides less aliasing distortions both in the x-and y-directions in comparison with the square pixel, though the MTF itself becomes inferior. The region in the vicinity of and higher than the Nyquist's frequency fn may be cut off by a high-cut filter, as already known in the conventional technique.

Figure 10:
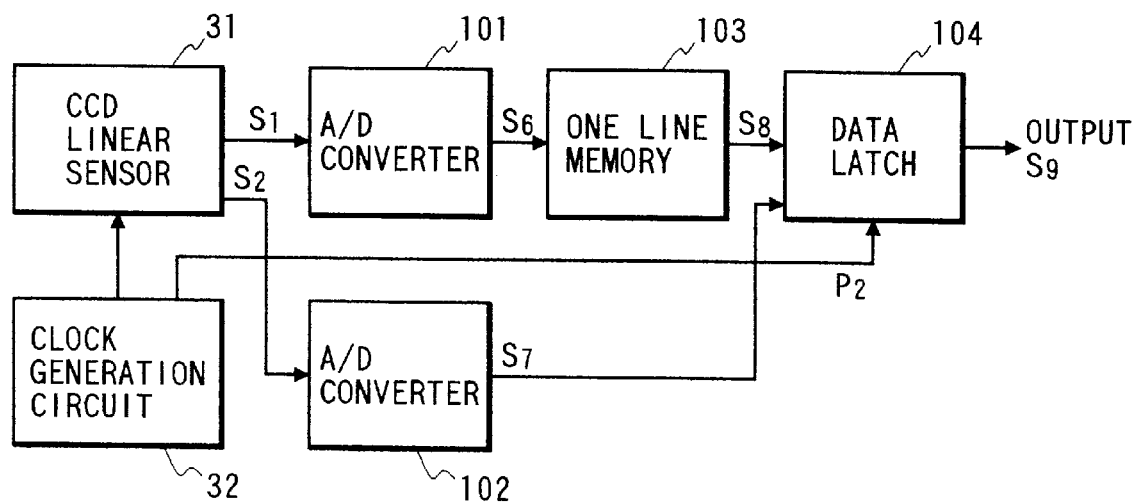
FIG. 10 is a block diagram of a second image processing circuit adapted for use in the first embodiment of the present invention.

FIG. 10 is a block diagram of a different circuit, employable in the first embodiment of the present invention, wherein same circuit blocks as in FIG. 3 are represented by same numbers. In FIG. 10 there are also shown A/D converters 101, 102 for A/D conversion of the output signals S1, S2 of the CCD linear image sensor, a 1-line memory 103, and a data latch circuit 104.

Figure 11:
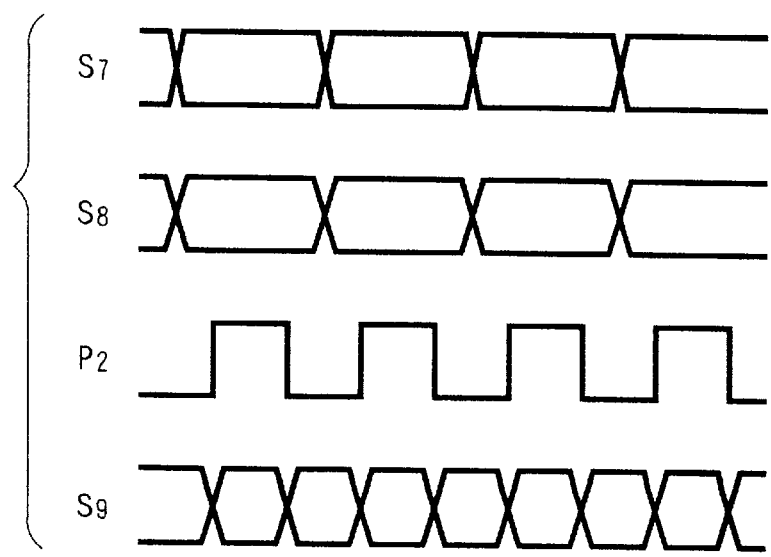
FIG. 11 is a signal waveform chart for explaining the function of the block diagram in FIG. 10.

FIG. 11 is a signal waveform chart for explaining the function of the circuit in FIG. 10, showing the states of signals after A/D conversion for each pixel. There are shown a digital output signal S7 of the A/D converter 102, an output signal S8 of the 1-line memory 103, and a latch command pulse P2 to be supplied to the data latch circuit. The signal S8 is latched at the upshift of the pulse P2, while the signal S7 is latched at the downshift thereof. S9 indicates the output signal of the data latch circuit 104.

Since the signal S8 is obtained by 1-line delay of a signal obtained by A/D conversion of the output signal S1 of the output circuit 7, the signals S8 and S7 are obtained from a same line-shaped optical image and are so spatially sampled that the optical image between the pixels in either of these signals is interpolated by the other. Consequently the time-sequential signal S9, with a doubled number of spatial sampling, can be obtained by latching the signals of signals of the adjacent pixels present at the same time, in succession with a delay of a half phase, by means of the pulse P2.

The first embodiment of the present invention, being capable of forming a time-sequential signal in digital manner as explained in the foregoing, can provide a high-quality image signal without an error in time resulting from the delay or the half phase shift in the one-line memory and without the deterioration in the frequency characteristics.

Figure 12:
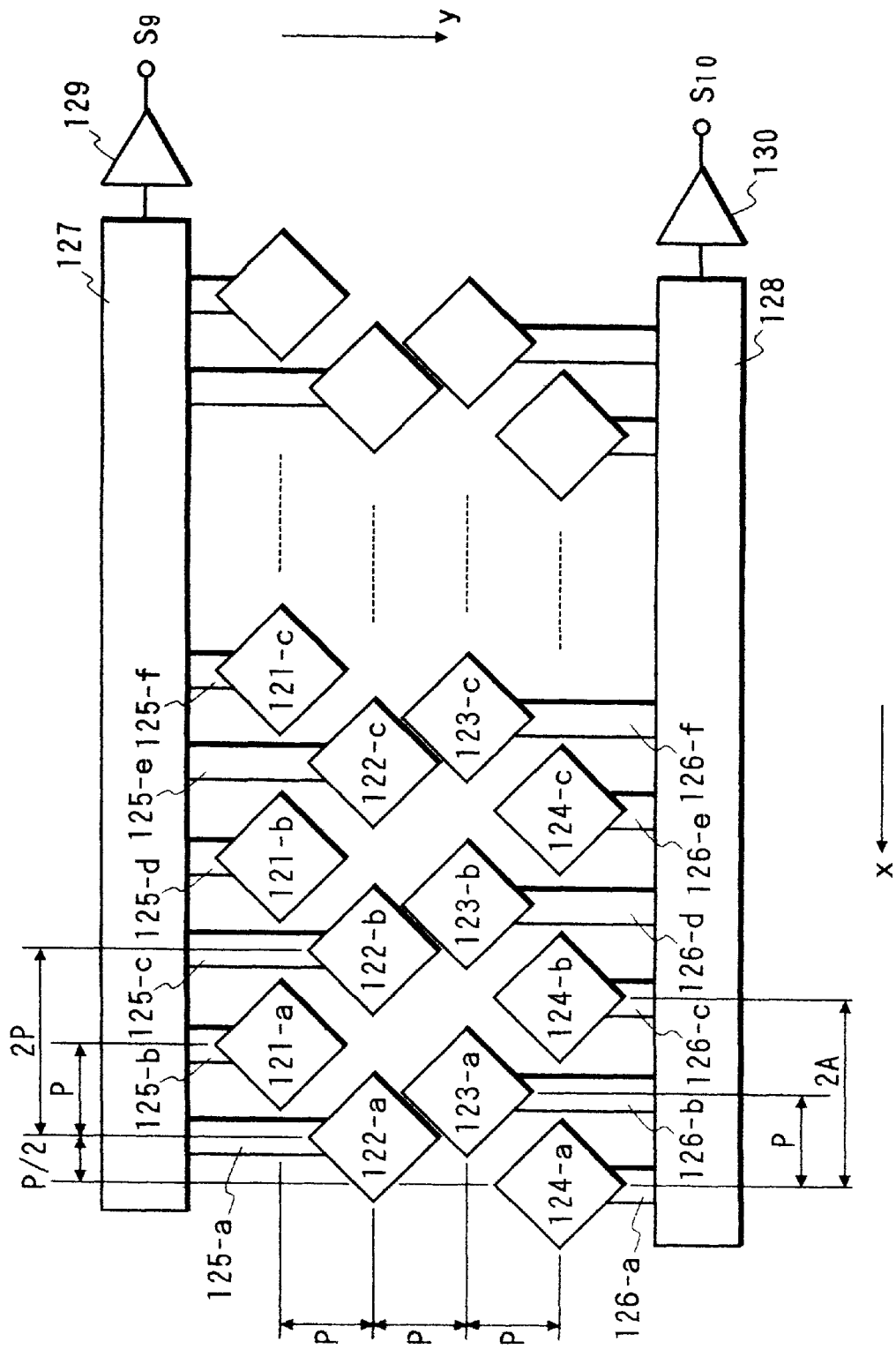
FIG. 12 is a view showing the configuration of a CCD linear image sensor constituting a second embodiment of the present invention.

FIG. 12 is a view showing the configuration of a linear image sensor constituting a second embodiment of the present invention.

In FIG. 12 there are shown arrays 121-a, b, c, ..., 122-a, b, c, ..., 123-a, b, c, ..., 124-a, b, c, ... of lozenge photoelectric converting pixels arranged one-dimensionally in the x-direction with a constant pitch; shift gates 125-a, b, c, ..., 126-a, b, c, ... for respectively shifting the charges obtained by photoelectric conversion in the photoelectric converting pixel arrays 121-a, b, c, ..., 122-a, b, c, ..., 123-a, b, c, ..., 124-a, b, c, ...; transfer units 127, 128 for successive transfer of thus shifted charges; and output circuits 129, 130 for releasing thus transferred charges as output signals S9, S10.

In the above-explained configuration, the pitch of the pixels in the x-direction in the above-mentioned four arrays of the photoelectric converting pixels is selected as 2P, and the mutual distance of these four arrays is selected as P, which is ½ of the pixel pitch 2P. Also the pixels in these four arrays are mutually displaced in the x-direction by P/2, or ¼ of the pixel pitch 2P, so as to achieve mutual interpolation.

The function of the present embodiment will be briefly explained with reference again to FIG. 2. The shift gates 125-a, b, c, ..., 126-a, b, c, ... are controlled by the shift gate control pulse φT shown in (a), whereby the charges of the photoelectric converting pixel arrays 121-a, b, c, ... and 122-a, b, c, ... are shifted to the transfer unit 127 while those of the photoelectric converting pixel arrays 123-a, b, c, ... and 124-a, b, c, ... are shifted to the transfer unit 128. Thereafter, as in the first embodiment, the charges in the transfer units 127, 128 are transferred in succession by the transfer clock pulses φA, φB shown in (b) and (c) to release the output signals S9, S10 from the output units 129, 130. The number of the transfer clock pulses φA, φB in a cycle is selected approximately equal to the number of pixels in the two photoelectric converting pixel arrays. Consequently the output signal S9 obtained from the output circuit 129 is a point-sequential signal in which the charges accumulated in the photoelectric converting pixel array 121-a, b, c, . . . and those in the photoelectric converting pixel array 122-a, b, c, . . . are alternated in every pixel. Similarly the output signal S10 obtained from the output circuit 130 is a point-sequential signal in which the charges accumulated in the photoelectric converting pixel array 123-a, b, c, . . . and those in the photoelectric converting pixel array 124-a, b, c, . . . are alternated in every pixel.

The optical image formed on the photoelectric converting pixel arrays moves in the y-direction with a predetermined speed, and travels by the distance P of the arrays in the y-direction within a cycle of the shift gate pulse φT. Consequently, a line-shaped optical image which generates charges in the photoelectric converting pixel array 121-a, b, c. . . similarly generates charges in the photoelectric converting pixel array 122-a, b, c. . . with a delay of one cycle of the shift gate pulse φT, also in the photoelectric converting pixel array 123-a, b, c. . . with a delay of two cycles and in the photoelectric converting pixel array 124-a, b, c. . . with a delay of three cycles.

Figure 13:
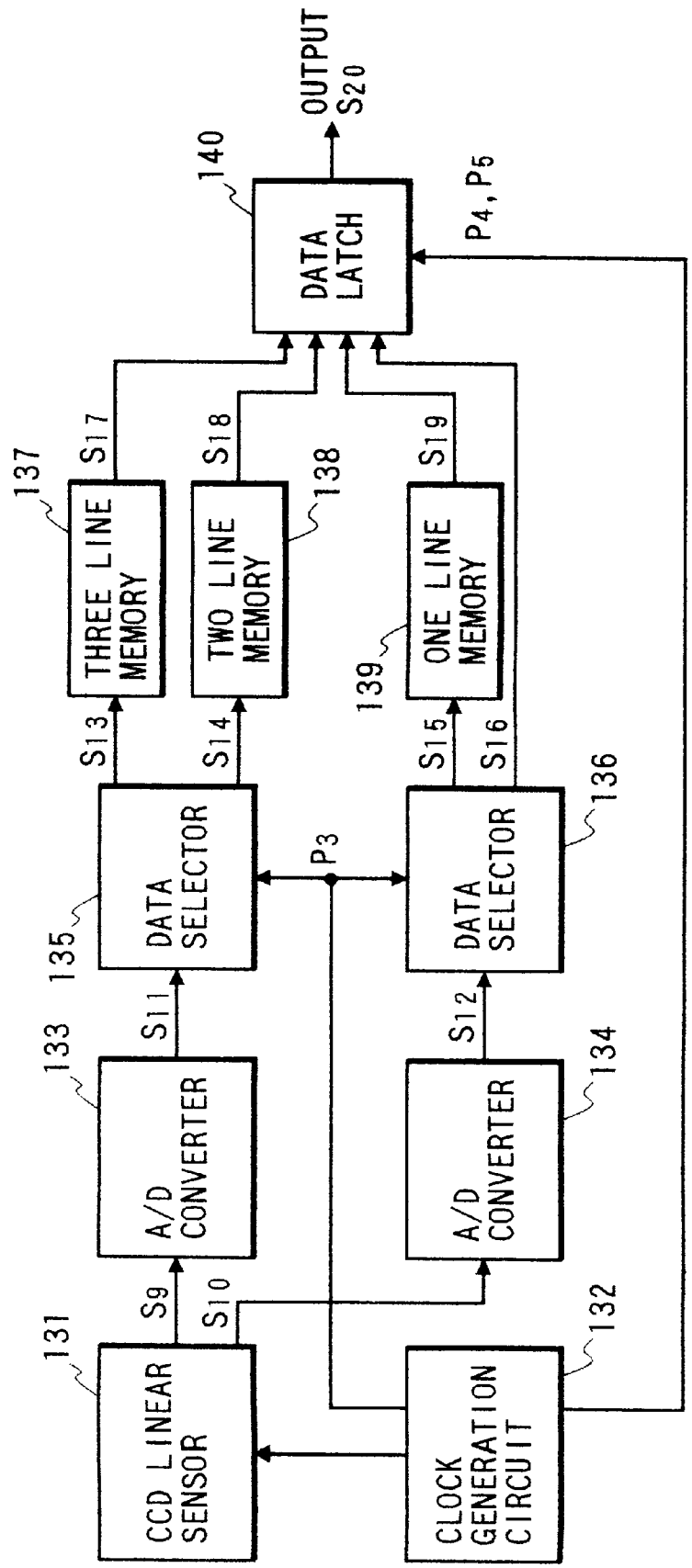
FIG. 13 is a block diagram of an image processing circuit adapted for use in the second embodiment of the present invention.

FIG. 13 is a block diagram of an image processing circuit, for processing thus obtained output signals.

In FIG. 13 there are shown a CCD linear sensor 131 of the configuration shown in FIG. 12; a clock generator 132 for generating clock pulses for driving the CCD linear sensor 131; A/D converters 133, 134 for A/D conversion of the output signals S9, S10 from the CCD linear sensor 131; selector circuits 135, 136 for separating the digital output signals S11, S12 of the A/D converters 133, 134 into data of odd pixels and those of even pixels; line memories 137, 138, 139 of respective capacities of one, two and three lines; and a data latch circuit 140.

Figure 14:
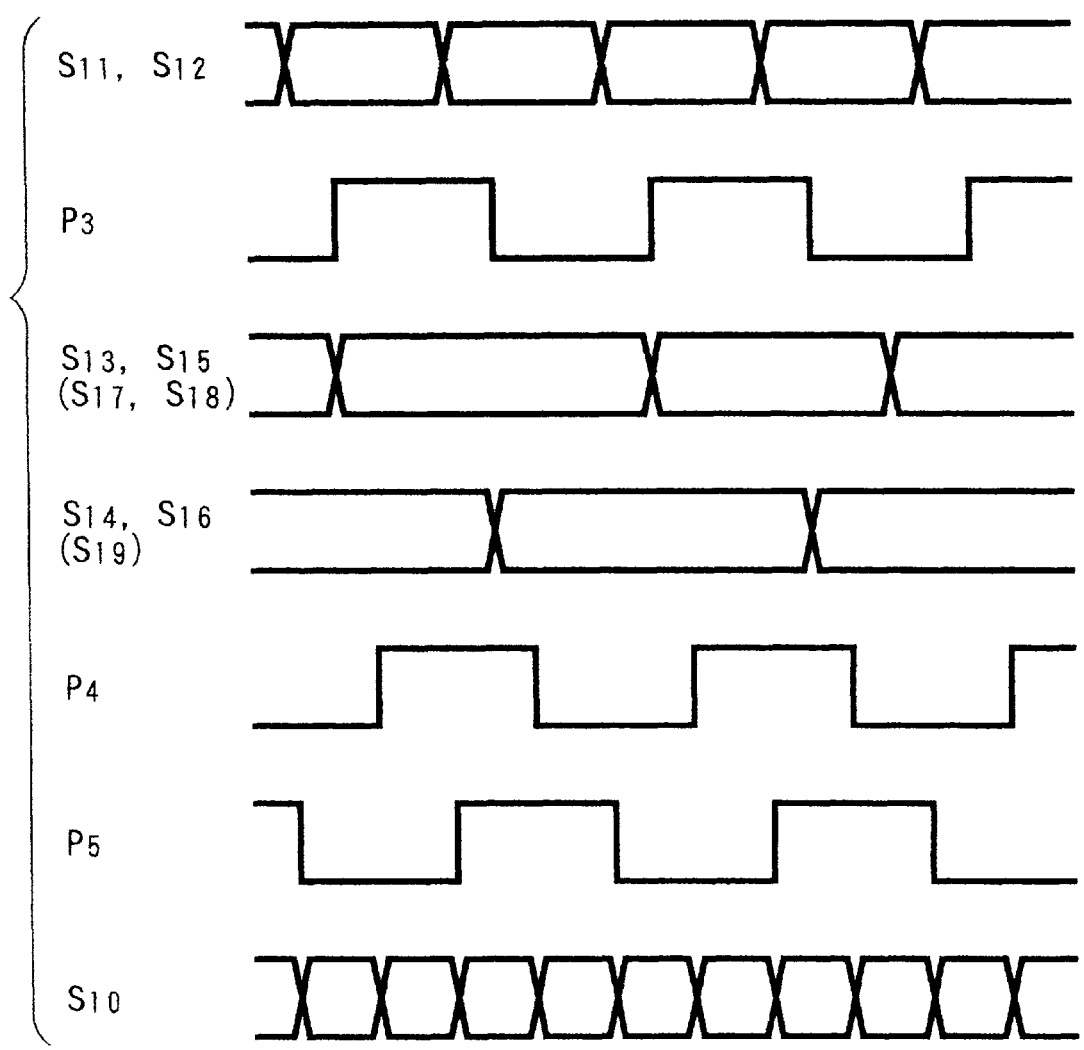
FIG. 14 is a signal waveform chart for explaining the function of the block diagram in FIG. 13.

FIG. 14 is a timing chart for explaining the function of the circuit shown in FIG. 13, showing the states of signals subjected to A/D conversion for each pixel.

There are shown digital output signals S11, S12 of the A/D converters 133, 134, and a latch command pulse P3 to be supplied to the data selector 135. The signals of odd pixels in the signal S11, S12 are latched at the upshift of the pulse P3 and are released as signal S13, S15. Also the signals of even pixels are latched at the downshift of the pulse P3 and are released as signals S14, S16. Latch command pulses P4, P5 are supplied to the data latch circuit 140. An output signal S17, obtained from the signal S13 after passing the 3-line memory is latched at the upshift of the pulse P4, while an output signal S18, obtained from the signal S14 after passing the 2-line memory is latched at the downshift of the pulse P4. Also an output signal S19, obtained from the signal S15 after passing the 1-line memory is latched at the upshift of the pulse P5, while the signal S16 is latched at the downshift of the pulse P5. S20 indicates the output signal of the data latch circuit 140.

In the above-explained configuration, the signal S17 is obtained by a 3-line delay of the signal from the photoelectric converting pixel array 121-a, b, c, . . . , while the signal S18 is obtained by a 2-line delay of the signal from the photoelectric converting pixel array 122-a, b, c, . . . , and the signal S19 is obtained by a 1-line delay of the signal from the photoelectric converting pixel array 123-a, b, c, . . . . Consequently the signals S16, S17, S18 and S19 are obtained from a same line-shaped optical image, and are latched in succession, with a phase difference of ¼ cycle, corresponding to the pixel arrangement in the x-direction. Therefore the output signal S20 of the data latch circuit 140 is a time-sequential signal of a high resolving power, with a quadrapled number of spatial samplings in the x-direction.

Figure 15:
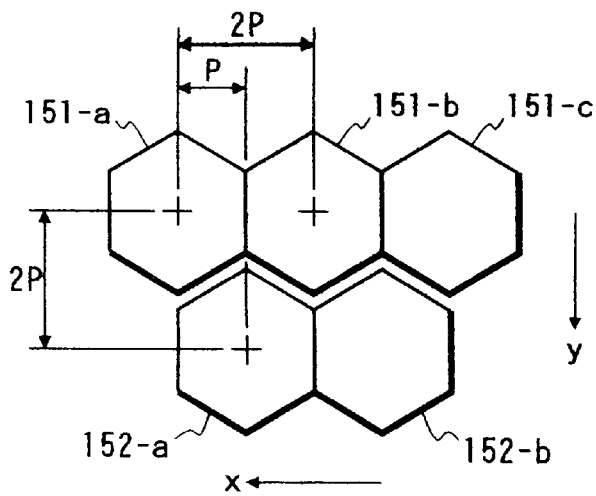
FIG. 15 is a view showing the configuration of a pixel unit of a CCD linear image sensor constituting a third embodiment of the present invention.

FIG. 15 is a view of a third embodiment of the present invention, wherein each pixel is formed as a normal hexagon.

There are provided two arrays of photoelectric converting pixels 151-a, b, c, . . . and 152-a, b, c, . . . , which have a pixel pitch of 2P both in the x- and y-directions and in which the pixels are arranged in such an interpolating manner that each pixel in either array is at the center of two pixels in the other array. In such arrangement the signals obtained from the array 151-a, b, c, . . . are passed by a 2-line delay line instead of the 1-line delay line 33 shown in FIG. 3, thereby these signals can be obtained from the same optical image corresponding to the signals obtained from the photoelectric converting pixel array 152-a, b, c, . . . . Therefore the output signal S5 shown in FIG. 3 becomes a point-sequential signal with a doubled number of spatial samplings in the x-direction, as in the first embodiment.

The present invention is applicable also to the pixels of other shapes, such as pentagon, octagon or circular. In general, it is applicable of the pixels of any shape in which the area per unit length decreases in the x- and y-directions from the center of the pixel.

As explained in the foregoing, the present invention allows to minimize the loss in the sensitivity even in the increase of number of pixels for improving the resolving power, since the area per pixel can be made larger in comparison with the conventional configuration. Also the deterioration in the transfer performance and the increase in heat generation or in power consumption in the transfer units can be avoided, since the transfer rate can be maintained same as in the conventional configuration by divided configuration of the transfer unit. Furthermore, the chip size in the x-direction can be maintained approximate same as that in the conventional configuration, thereby avoiding the increase in the cost of the linear image sensor or of the lens.

Many widely different embodiments of the present invention may be constructed without departing from the spirit and scope of the present invention. It should be understood that the present invention is not limited to the specific embodiments described in the specification, except as defined in the appended claims.

What is claimed is:

1. A linear image sensor comprising n arrays of photoelectric converting pixels, wherein n is an even integer at least equal to 2, each said array being formed by arranging, with a predetermined pixel pitch in a first direction of said array, a plurality of pixels, each of which pixels is so shaped that an area per unit length of said pixel decreases progressively from the center of said pixel both in the first direction of said array and in a second direction perpendicular to the first direction, wherein said n arrays are provided with a mutual distance from each other of m/2 times said pixel pitch in the second direction and are mutually displaced by 1/n of said pixel pitch in the first direction of said array so as to form a mutually interpolating arrangement, wherein m is a positive integer equal to at least 1 and wherein m and n are independent of each other.

2. A linear image sensor according to claim 1, wherein each of said pixels has a normal polygonal shape.

3. A linear image sensor according to claim 1, wherein each of said pixels has a circular shape.

4. A linear image sensor according to claim 1, further comprising:

reading means for reading an image signal from each of said n arrays of photoelectric converting pixels;

delay means for delaying the image signal, read by said reading means, corresponding to said mutual distance of the arrays;

shift means for shifting a phase of the image signal corresponding to said pixel pitch; and synthesizing means for synthesizing the image signal delayed by said delay means and the image signal subjected to phase shifting by said shift means.

5. A linear image sensor according to claim 4, wherein each of said pixels has a normal polygonal shape.

6. A linear image sensor according to claim 4, wherein each of said pixels has a circular shape.

7. A linear image sensor according to claim 4, wherein said reading means is adapted to read the image signal of a line from said arrays of the photoelectric converting pixels within a predetermined period, and said delay means is adapted to delay the image signal by m times said predetermined period.

8. A linear image sensor according to claim 7, wherein each of said pixels has a normal polygonal shape.

9. A linear image sensor according to claim 7, wherein each of said pixels has a circular shape.

10. A linear image sensor according to claim 7, wherein said shifting means is adapted to shift the phase of said image signal by 2 π/n.

11. A linear image sensor according to according to claim 10, wherein each of said pixels has a normal polygonal shape.

12. A linear image sensor according to according to claim 10, wherein each of said pixels has a circular shape.

13. A linear image sensor according to claim 1, further comprising:

reading means for reading an image signal from each of said n arrays of photoelectric converting pixels;

A/D conversion means for converting an output of said reading means into a digital image signal;

a memory for storing at least one line of the digital image signal converted by said A/D conversion means; and latch means for latching, at a predetermined timing, the digital image signal stored in said memory or the digital image signal released from said A/D conversion means.

14. A linear image sensor according to claim 13, wherein said reading means is adapted to read the image signal of each line from said arrays of the photoelectric converting pixels within a predetermined period, and said memory is adapted to store said digital image signal by a delay time corresponding to m times said predetermined period.

15. A linear image sensor according to claim 13, wherein said latch means is adapted to so latch the digital image signal stored in said memory and the digital image signal released from said A/D conversion means that said digital image signals are mutually shifted in phase by 2 π/n.

16. A linear image sensor according to claim 13, wherein each of said pixels has a normal polygonal shape.

17. A linear image sensor according to claim 14, wherein each of said pixels has a normal polygonal shape.

18. A linear image sensor according to claim 15, wherein each of said pixels has a normal polygonal shape.

19. A linear image sensor according to claim 13, wherein each of said pixels has a circular shape.

20. A linear image sensor according to claim 14, wherein each of said pixels has a circular shape.

21. A linear image sensor according to claim 15, wherein each of said pixels has a circular shape.

* * * * *

UNITED STATES PATENT AND TRADEMARK OFFICE
CERTIFICATE OF CORRECTION

PATENT NO. : 5,956,087
DATED : September 21, 1999
INVENTOR(S) : TSUTOMU TAKAYAMA ET AL.

Page 1 of 3

It is certified that error appears in the above-identified patent and that said Letters Patent is hereby corrected as shown below:

SHEET 6:

FIG. 9D, "NORMARIZED" should read --NORMALIZED--.

COLUMN 5:

Line 32, "cross" should read --cross---;
Line 38, "cross sectional" should read --cross-sectional--;
Line 59, "$\Delta \ell = (\frac{1}{2})(1 + \cos\omega \ x) - (\frac{1}{2})(1 + \cos\omega \ ) = \cos\omega$" should read
--$\Delta \ell = (\frac{1}{2})(1 + \cos\omega \ x) - (\frac{1}{2})(1 + \cos\omega \ x) = \cos\omega \ x$--; and
Line 64, "$\chi$:" should read --x:--

COLUMN 6:

Line 1-4,
"$\Delta Xll = 2\int_0^{L/2} Sxl \bullet \Delta l dx = 2\int_0^{L/2} L \bullet \cos\omega x dx = (2L/\omega)\sin(\omega \frac{1}{2})$    (3)"
should read
--$\Delta Xll = 2\int_0^{L/2} Sxl \bullet \Delta l dx = 2\int_0^{L/2} L \bullet \cos\omega x \ dx = (2L/\omega)\sin(\omega \frac{1}{2})$    (3)--
and "$Sx2 = (L/2 - \chi) \bullet 1 + L/2 - \chi$  (14)" should read
--$Sx2 = (L/2 - x) \bullet 1 + L/2 - x$  (14)-- and

UNITED STATES PATENT AND TRADEMARK OFFICE
CERTIFICATE OF CORRECTION

PATENT NO. : 5,956,087

DATED : September 21, 1999

INVENTOR(S) : TSUTOMU TAKAYAMA ET AL.

It is certified that error appears in the above-identified patent and that said Letters Patent is hereby corrected as shown below:

"
$$\Delta X11 = 4\int_0^{L/2} Sx2 \cdot \Delta l dx = 4\int_0^{L/2}(L-2x)\cos\omega x dx \qquad (15)$$
$$= (4/\omega^2\{1-\cos(\omega L/2)\}$$
$$= (8/\omega^2)\sin^2(\omega L/4)$$
" should read --
$$\Delta X11 = 4\int_0^{L/2} Sx2 \cdot \Delta l d^x = 4\int_0^{L/2}(L-2x)\cos\omega^x d^x \qquad (15)$$
$$= (4/\omega^2\{1-\cos(\omega L/2)\}$$
$$= (8/\omega^2)\sin^2(\omega L/4)$$
--.

Line 10, "$\Delta X_0 1 = 2\int_0^{L/2} Sxl \cdot \Delta l dx = 2\int_0^{L/2} L dx = L^2$" should read --$\Delta X_0 1 = 2\int_0^{L/2} Sxl \cdot Id x = 2\int_0^{L/2} L d x = L^2$ --; and Line 20, "cross sectional" should read
--cross-sectional--.

COLUMN 7:

Line 47, "cross sectional" should read
--cross-sectional--.

COLUMN 8:

Line 31, "cross sectional" should read
--cross-sectional--; and
Line 59, "cross sectional" should read
--cross-sectional--.

UNITED STATES PATENT AND TRADEMARK OFFICE
CERTIFICATE OF CORRECTION

PATENT NO. : 5,956,087

DATED : September 21, 1999

INVENTOR(S) : TSUTOMU TAKAYAMA ET AL.

It is certified that error appears in the above-identified patent and that said Letters Patent is hereby corrected as shown below:

COLUMN 9:

Line 62, "x-and" should read --x- and--.

COLUMN 13:

Line 26, "according to" (second occurrence) should be deleted; and
    Line 29, "according to" (second occurrence) should be deleted.

Signed and Sealed this

Twenty-second Day of May, 2001

Attest:

NICHOLAS P. GODICI

*Attesting Officer*    *Acting Director of the United States Patent and Trademark Office*